US010560099B1

(12) United States Patent
Hong et al.

(10) Patent No.: US 10,560,099 B1
(45) Date of Patent: Feb. 11, 2020

(54) SEMICONDUCTOR APPARATUS USING SWING LEVEL CONVERSION CIRCUIT

(71) Applicant: SK hynix Inc., Icheon-si, Gyeonggi-do (KR)

(72) Inventors: Gi Moon Hong, Seoul (KR); Kyung Hoon Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/237,441

(22) Filed: Dec. 31, 2018

(30) Foreign Application Priority Data

Jul. 19, 2018 (KR) ........................ 10-2018-0084174

(51) Int. Cl.
*H03K 19/0948* (2006.01)
*H03K 19/00* (2006.01)
*H03K 19/0185* (2006.01)

(52) U.S. Cl.
CPC ..... *H03K 19/0948* (2013.01); *H03K 19/0013* (2013.01); *H03K 19/018521* (2013.01)

(58) Field of Classification Search
CPC ....... H03K 19/0013; H03K 19/018521; H03K 19/0948; H03K 5/1565; H03K 5/14; H03K 3/012; H03K 3/017
See application file for complete search history.

(56) References Cited

U.S. PATENT DOCUMENTS 7,936,186 B1 * 5/2011 Tong .................... H03K 5/1565
326/127

FOREIGN PATENT DOCUMENTS

KR    1020110024303 A    3/2011

OTHER PUBLICATIONS

English Translation of KR 10-2011-0024303, Kwon, which was made of record in the Information Disclosure Statement filed Dec. 31, 2018. (Year: 2011).*
Hye-Yoon Joo et al., "A 20nm 9Gb/s/pin 8Gb GDDR5 DRAM with an NBTI Monitor, Jitter Reduction Techniques and Improved Power Distribution", ISSCC 2016 / Session 18 / High-Bandwidth DRAM / 18.1, Feb. 3, 2016, pp. 314-315, 2016 IEEE International Solid-State Circuits Conference, Samsung Electronics, Hwaseong, Korea.

* cited by examiner

*Primary Examiner* — John W Poos
(74) *Attorney, Agent, or Firm* — William Park & Associates Ltd.

(57) ABSTRACT

A semiconductor apparatus includes an input selection circuit that selects one of a first input signal and a second input signal in response to a control signal, and outputs the selected input signal as a selection signal, wherein swing levels of the first input signal and the second input signal are different one another. The semiconductor apparatus also includes a conversion circuit that generates an output signal, in response to the selection signal, which swings to a level substantially identical to a level of the second input signal.

14 Claims, 3 Drawing Sheets

SEMICONDUCTOR APPARATUS USING SWING LEVEL CONVERSION CIRCUIT

CROSS-REFERENCES TO RELATED APPLICATION

The present application claims priority under 35 U.S.C. § 119(a) to Korean application number 10-2018-0084174, filed on Jul. 19, 2018, in the Korean Intellectual Property Office, which is incorporated herein by reference in its entirety.

BACKGROUND

1. Technical Field

Various embodiments generally relate to a semiconductor integrated circuit, and, more particularly, to a semiconductor apparatus.

2. Related Art

Electronic devices such as personal computers, tablet PCs, laptop computers, and smart phones include various electronic circuits. The electronic devices are configured such that electrical signals are transmitted/received between the electronic circuits. In general, the electronic circuits may be electrically connected to one another through a bus and may transmit/receive a signal through an interface.

A swing width of a signal transmitted/received between the electronic circuits may be different from that of a signal transmitted/received in the electronic circuits.

For example, signals transmitted/received between the electronic circuits may swing to a current mode logic (CML) level, and signals transmitted/received in the electronic circuits may swing to a complementary metal-oxide semiconductor (CMOS) level.

Accordingly, a semiconductor apparatus including electronic circuits needs to include a conversion circuit that converts a signal at the CML level to a signal at the CMOS level.

An electronic circuit uses a signal that swings to the CMOS level when operating at a low speed and uses a signal that swings to the CML level when operating at a high speed. In general, it is known that power efficiency is high when the electronic circuit uses a signal that swings to the CMOS level in a low speed operation and uses a signal that swings to the CML level in a high speed operation.

SUMMARY

In an embodiment, a semiconductor apparatus may include an input selection circuit configured to select one of a first input signal and a second input signal in response to a control signal and configured to output the selected input signal as a selection signal, wherein swing levels of the first input signal and the second input signal are different from one another. The semiconductor apparatus may also include a conversion circuit configured to generate an output signal, in response to the selection signal, wherein the output signal swings to a level substantially identical to a level of the second input signal.

In an embodiment, a semiconductor apparatus may include a first input circuit including a capacitor that receives a first input signal at a current mode logic (CML) level and transfers the first input signal to an output circuit. The semiconductor apparatus may also include a second input circuit configured to, based on a control signal, transfer a second input signal at a complementary metal-oxide semiconductor (CMOS) level to the output circuit or substantially prevent the transfer of the second input signal to the output circuit. The semiconductor apparatus may further include the output circuit configured to perform at least one of an inverting operation and a resistive feedback inverting operation on output of the first and second input circuits based on the control signal.

DETAILED DESCRIPTION

Hereinafter, a semiconductor apparatus is described below with reference to the accompanying drawings through various examples of embodiments. For example, a semiconductor apparatus including a conversion circuit capable of changing a swing width of a signal. According to some embodiments, the semiconductor apparatus has an advantage of supporting high speed operation with low power consumption and supporting both high speed operation and low speed operation.

Figure 1:
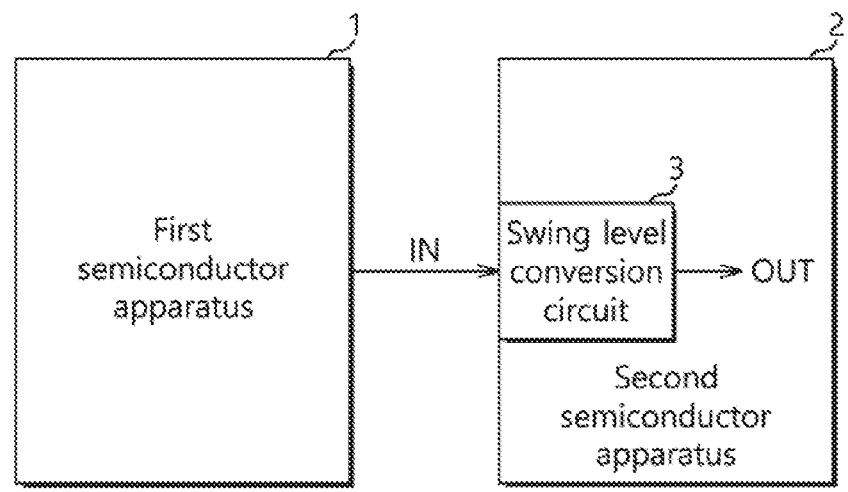
FIG. 1 shows a configuration diagram of a semiconductor system, in accordance with an embodiment.

FIG. 1 shows a configuration diagram of a semiconductor system, in accordance with an embodiment, and illustrates a semiconductor system that transmits/receives an electrical signal between semiconductor apparatuses 1 and 2.

As illustrated, the semiconductor system includes a first semiconductor apparatus 1 and a second semiconductor apparatus 2.

The first semiconductor apparatus 1 and the second semiconductor apparatus 2 may be electronic circuits communicating with each other. The first semiconductor apparatus 1 may be a master device and the second semiconductor apparatus 2 may be a slave device operating under the control of the first semiconductor apparatus 1. For example, the first semiconductor apparatus 1 may be a host device, such as a processor, and the processor may include a central processing unit (CPU), a graphic processing unit (GPU), a multimedia processor (MMP), or a digital signal processor. Furthermore, the first semiconductor apparatus 1 may be provided in the form of a system on chip by combining processor chips (for example, application processors (APs)) having various functions with each other.

The second semiconductor apparatus 2 may be a memory, and the memory may include a volatile memory and a nonvolatile memory. Examples of volatile memory may include a static RAM (SRAM), a dynamic RAM (DRAM), and a synchronous DRAM (SDRAM), and examples of nonvolatile memory may include a read only memory (ROM), a programmable ROM (PROM), an electrically erasable and programmable ROM (EEPROM), an electrically programmable ROM (EPROM), a flash memory, a phase-change RAM (PRAM), a magnetic RAM (MRAM), a resistive RAM (RRAM), a ferroelectric RAM (FRAM), and the like.

The first semiconductor apparatus 1 may provide an input signal IN to the second semiconductor apparatus 2.

The second semiconductor apparatus 2 may receive the input signal IN from the first semiconductor apparatus 1. The second semiconductor apparatus 2 may internally generate an output signal OUT based on the input signal IN. In such case, a swing level of the input signal IN and a swing level of the output signal OUT may be different from or substantially identical to each other. For some embodiments, "substantially identical to" means "substantially the same as." The second semiconductor apparatus 2 may include a swing level conversion circuit 3 that generates the output signal OUT based on the input signal IN. A swing level of a signal inputted from the first semiconductor apparatus 1 to the second semiconductor apparatus 2 may be different from or substantially identical to that of a signal used in the second semiconductor apparatus 2.

The swing level conversion circuit 3 may generate the output signal OUT that swings to a second setting level based on the input signal IN that swings to a first setting level. The first setting level may be a current mode logic (CML) level and the second setting level may be a complementary metal-oxide semiconductor (CMOS) level. Furthermore, the swing level conversion circuit 3 may receive a signal at the CML level and output a signal at the CMOS level.

According to the semiconductor system in a low speed operation mode, a level of a signal transferred from the first semiconductor apparatus 1 to the second semiconductor apparatus 2 may be at the CMOS level. In a high speed operation mode, a level of a signal transferred from the first semiconductor apparatus 1 to the second semiconductor apparatus 2 may be at the CML level. That is, in a low speed operation mode, a level of the input signal IN received by the second semiconductor apparatus 2 and a level of the output signal OUT internally generated by the second semiconductor apparatus 2 may be substantially identical to each other, and in a high speed operation mode, a level of the input signal IN received by the second semiconductor apparatus 2 and a level of the output signal OUT internally generated by the second semiconductor apparatus 2 may be different from each other.

Figure 2:
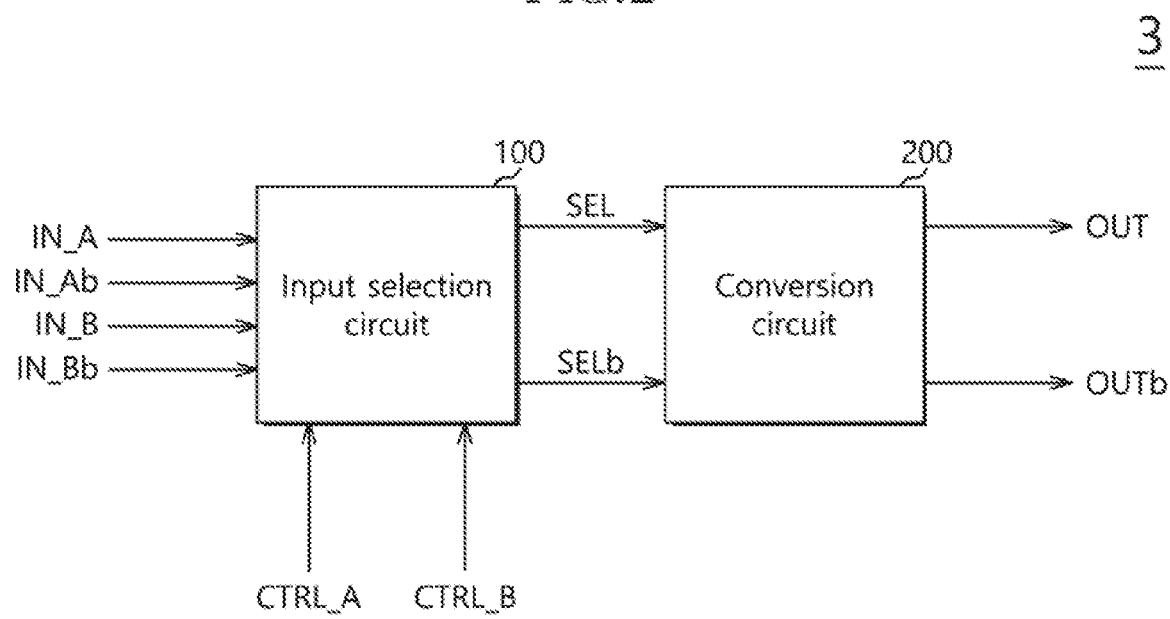
FIG. 2 shows a configuration diagram of a swing level conversion circuit of FIG. 1, in accordance with an embodiment.

In FIG. 1, the relation between the semiconductor apparatuses may be changed to a relation between a transmission circuit 1 and a reception circuit 2 used in the semiconductor apparatus, and the reception circuit 2 may include the swing level conversion circuit 3. FIG. 2 shows a configuration diagram of the swing level conversion circuit 3, in accordance with an embodiment.

The swing level conversion circuit 3 may receive and output signals. For example, the swing level conversion circuit 3 may receive a first input signal pair IN_A and IN_Ab, a second input signal pair IN_B and IN_Bb, and first and second control signals CTRL_A and CTRL_B, and may output an output signal pair OUT and OUTb.

The first input signal pair IN_A and IN_Ab may include a first input signal IN_A and a first input bar signal IN_Ab, and the first input signal IN_A and the first input bar signal IN_Ab may be complementary signals. The second input signal pair IN_B and IN_Bb may include a second input signal IN_B and a second input bar signal IN_Bb, and the second input signal IN_B and the second input bar signal IN_Bb may be complementary signals. The output signal pair OUT and OUTb may include an output signal OUT and an output bar signal OUTb, and the output signal OUT and the output bar signal OUTb may be complementary signals. The first input signal pair IN_A and IN_Ab may be signals at the CML level, and the second input signal pair IN_B and IN_Bb may be signals at the CMOS level. The output signal pair OUT and OUTb may be signals at the CMOS level.

The swing level conversion circuit 3, for example, may select one input signal pair, in this case the first input signal pair IN_A and IN_Ab, at the CML level and the second input signal pair, IN_B and IN_Bb, at the CMOS level according to the first and second control signals CTRL_A and CTRL_B. The swing level conversion circuit 3 may generate and output the output signal pair OUT and OUTb based on the selected input signal pair.

The swing level conversion circuit 3 may include an input selection circuit 100 and a conversion circuit 200.

The input selection circuit 100 may receive the first and second control signals CTRL_A and CTRL_B, the first input signal pair IN_A and IN_Ab, and the second input signal pair IN_B and IN_Bb, and output a selection signal pair SEL and SELb. For example, the input selection circuit 100 may select one pair of the first input signal pair IN_A and IN_Ab and the second input signal pair IN_B and IN_Bb, according to an enabled signal of the first and second control signals CTRL_A and CTRL_B, and output the selected pair as the selection signal pair SEL and SELb. In more detail, when the first control signal CTRL_A of the first and second control signals CTRL_A and CTRL_B is enabled, the input selection circuit 100 may output the first input signal pair IN_A and IN_Ab as the selection signal pair SEL and SELb. When the second control signal CTRL_B of the first and second control signals CTRL_A and CTRL_B is enabled, the input selection circuit 100 may output the second input signal pair IN_B and IN_Bb as the selection signal pair SEL and SELb. The first and second control signals CTRL_A and CTRL_B may be complementary signals.

The conversion circuit 200 may receive the selection signal pair SEL and SELb and output the output signal pair OUT and OUTb. For example, the conversion circuit 200 may generate the output signal pair OUT and OUTb according to the selection signal pair SEL and SELb. In more detail, the conversion circuit 200 may generate the output signal pair OUT and OUTb at the CMOS level according to the selection signal pair SEL and SELb.

Figure 3:
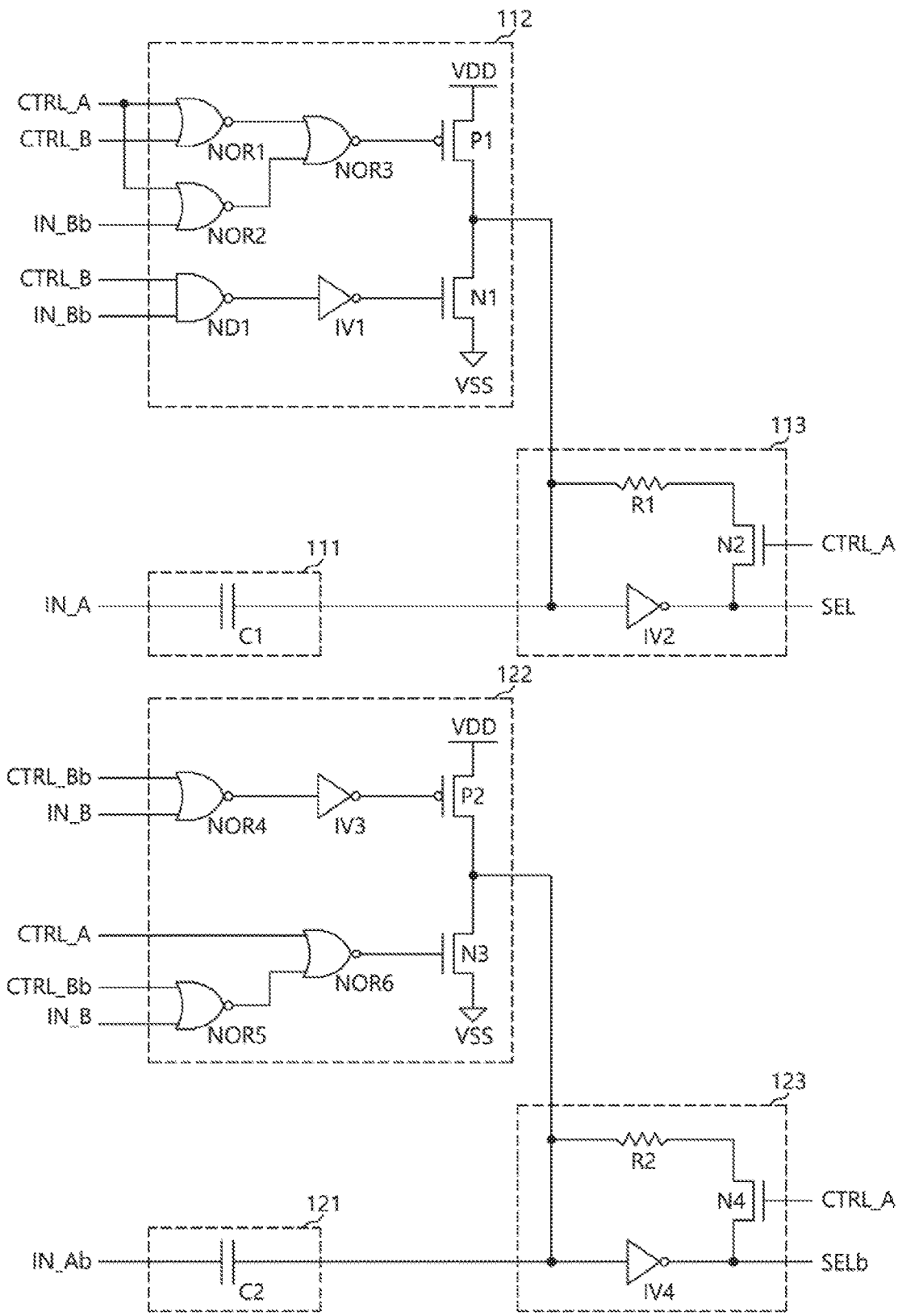
FIG. 3 shows a configuration diagram of an input selection circuit of FIG. 2, in accordance with an embodiment.

Referring to FIG. 3, the input selection circuit 100 may include first to fourth input circuits 111, 112, 121, and 122 and first and second output circuits 113 and 123. The first input circuit 111 may receive the first input signal IN_A and transfer the first input signal IN_A to the first output circuit 113.

The first input circuit 111 may include a first capacitor C1. The first capacitor C1 may receive the first input signal IN_A through one end thereof and may be electrically connected to the first output circuit 113 through the other end thereof.

The second input circuit 112 receives the first and second control signals CTRL_A and CTRL_B and the second input bar signal IN_Bb. Based on the first and second control signals CTRL_A and CTRL_B, the second input circuit 112 may transfer the second input bar signal IN_Bb to the first output circuit 113 or may substantially prevent the transfer of the second input bar signal IN_Bb to the first output circuit 113. For example, when the first control signal CTRL_A is enabled to a high level and the second control signal CTRL_B is disabled to a low level, the second input circuit 112 may substantially prevent the transfer of the second input bar signal IN_Bb to the first output circuit 113. When the first control signal CTRL_A is disabled to a low level and the second control signal CTRL_B is enabled to a high level, the second input circuit 112 may transfer the second input bar signal IN_Bb to the first output circuit 113.

The second input circuit 112 may include first, second, and third NOR gates NOR1, NOR2, and NOR3, a NAND gate ND1, a first inverter IV1, and first and second transistors P1 and N1. The first NOR gate NOR1 receives the first and second control signals CTRL_A and CTRL_B. The second NOR gate NOR2 receives the first control signal CTRL_A and the second input bar signal IN_Bb. The third NOR gate NOR3 receives output signals of the first and second NOR gates NOR1 and NOR2. The NAND gate ND1 receives the second control signal CTRL_B and the second input bar signal IN_Bb. The first inverter IV1 receives an output signal of the NAND gate ND1. The first transistor P1 receives an output signal of the third NOR gate NOR3 through a gate thereof and receives a first power supply voltage VDD through a source thereof. The second transistor N1 receives an output signal of the first inverter IV1 through a gate thereof, is electrically connected to a drain of the first transistor P1 through a drain thereof, and receives a second power supply voltage VSS through a source thereof. A node, at which the first and second transistors P1 and N1 are electrically connected to each other, is commonly connected to an output terminal of the first input circuit 111 and an input terminal of the first output circuit 113. A voltage level of the first power supply voltage VDD may be higher than that of the second power supply voltage VSS.

The first output circuit 113 receives the output signals of the first and second input circuits 111 and 112 and the first control signal CTRL_A. Based on the first control signal CTRL_A, the first output circuit 113 may perform a resistive feedback inverting operation on the output signals of the first and second input circuits 111 and 112, and output the operation result as a selection signal SEL. For example, when the first control signal CTRL_A is enabled to a high level, the first output circuit 113 may perform the resistive feedback inverting operation on the output signals of the first and second input circuits 111 and 112, and output the operation result as the selection signal SEL. When the first control signal CTRL_A is disabled to a low level, the first output circuit 113 may perform an inverting operation on the output signals of the first and second input circuits 111 and 112, and output the operation result as the selection signal SEL. In such a case, when the first control signal CTRL_A is disabled to a low level, the first output circuit 113 performs an inverting operation for inverting the output signals of the first and second input circuits 111 and 112 and outputting the inverted signal as the selection signal SEL. When the first control signal CTRL_A is enabled to a high level, the first output circuit 113 inverts the output signals of the first and second input circuits 111 and 112 only for a predetermined time, outputs the inverted signal as the selection signal SEL, and returns the selection signal SEL to an average swing level after the predetermined time.

The first output circuit 113 may include a second inverter IV2, a third transistor N2, and a first resistor R1. The second inverter IV2 has an input terminal to which the output terminals of the first and second input circuits 111 and 112 are commonly connected, and an output terminal from which the selection signal SEL is outputted. The third transistor N2 receives the first control signal CTRL_A through a gate thereof, and is electrically connected to the output terminal of the second inverter IV2 and one end of the first resistor R1 through a drain and a source thereof. The first resistor R1 is electrically connected to the output terminal of the second inverter IV2 through one end thereof and is electrically connected to the input terminal of the second inverter IV2 through the other end thereof.

In the first output circuit 113 configured as described above, when the first control signal CTRL_A is enabled to a high level, an output signal of the second inverter IV2 may be inputted as an input signal of the second inverter IV2 after a delay time due to a resistance value of the first resistor R1. The resistive feedback inverting operation of the first output circuit 113 may include an operation in which the output signal of the second inverter IV2 is inputted again as the input signal of the second inverter IV2 via the first resistor R1.

The third input circuit 121 may receive the first input bar signal IN_Ab and transfer the first input bar signal IN_Ab to the second output circuit 123. The third input circuit 121 may include a second capacitor C2. The second capacitor C2 receives the first input bar signal IN_Ab through one end thereof and is electrically connected to the second output circuit 123 through the other end thereof.

The fourth input circuit 122 receives the first control signal CTRL_A, an inverted second control signal CTRL_Bb, and the second input signal IN_B. Based on the first control signal CTRL_A and the inverted second control signal CTRL_Bb, the fourth input circuit 122 may transfer the second input signal IN_B to the second output circuit 123 or substantially prevent the transfer of the second input signal IN_B to the second output circuit 123. For example, when the first control signal CTRL_A is enabled to a high level and the inverted second control signal CTRL_Bb is disabled to a high level, the fourth input circuit 122 may substantially prevent the transfer of the second input signal IN_B to the second output circuit 123. When the first control signal CTRL_A is disabled to a low level and the inverted second control signal CTRL_Bb is enabled to a low level, the fourth input circuit 122 may transfer the second input signal IN_B to the second output circuit 123.

The fourth input circuit 122 may include fourth, fifth, and sixth NOR gates NOR4, NOR5, and NOR6, a third inverter IV3, and fourth and fifth transistors P2 and N3. The fourth NOR gate NOR4 receives the inverted second control signal CTRL_Bb and the second input signal IN_B. The third inverter IV3 receives an output signal of the fourth NOR gate NOR4. The fifth NOR gate NOR5 receives the inverted second control signal CTRL_Bb and the second input signal IN_B. The sixth NOR gate NOR6 receives an output signal of the fifth NOR gate NOR5 and the first control signal CTRL_A. The fourth transistor P2 receives the output signal of the third inverter IV3 through a gate thereof, and receives the first power supply voltage VDD through a source thereof. The fifth transistor N3 receives the output signal of the sixth NOR gate NOR6 through a gate thereof, is electrically connected to a drain of the fourth transistor P2 through a drain thereof, and receives the second power supply voltage VSS through a source thereof. A node, at which the fourth and fifth transistors P2 and N3 are commonly connected to each other, is commonly connected to an output terminal of the third input circuit 121 and an input terminal of the second output circuit 123. The logical elements (the NOR gates NOR, the NAND gates NAND, and the inverters IV) illustrated in FIG. 3 may receive the first and second power supply voltages VDD and VSS as driving voltages.

The second output circuit 123 receives the output signals of the third and fourth input circuits 121 and 122 and the first control signal CTRL_A. Based on the first control signal CTRL_A, the second output circuit 123 may perform the resistive feedback inverting operation on the output signals of the third and fourth input circuits 121 and 122, and output the operation result as a selection bar signal SELb. For example, when the first control signal CTRL_A is enabled to a high level, the second output circuit 123 may perform the resistive feedback inverting operation on the output signals of the third and fourth input circuits 121 and 122, and output the operation result as the selection bar signal SELb. When the first control signal CTRL_A is disabled to a low level, the second output circuit 123 may perform an inverting operation on the output signals of the third and fourth input circuits 121 and 122, and output the operation result as the selection bar signal SELb. In such a case, when the first control signal CTRL_A is disabled to a low level, the second output circuit 123 performs an inverting operation for inverting the output signals of the third and fourth input circuits 121 and 122, and outputting the inverted signal as the selection bar signal SELb. When the first control signal CTRL_A is enabled to a high level, the second output circuit 123 inverts the output signals of the third and fourth input circuits 121 and 122 only for a predetermined time, outputs the inverted signal as the selection bar signal SELb, and returns the selection bar signal SELb to an average swing level after the predetermined time.

The second output circuit 123 may include a fourth inverter IV4, a sixth transistor N4, and a second resistor R2. The fourth inverter IV4 has an input terminal to which the output terminals of the third and fourth input circuits 121 and 122 are commonly connected, and an output terminal from which the selection bar signal SELb is outputted. The sixth transistor N4 receives the first control signal CTRL_A through a gate thereof, and is electrically connected to an output terminal of the fourth inverter IV4 and one end of the second resistor R2 through a drain and a source thereof. The second resistor R2 is electrically connected to the output terminal of the fourth inverter IV4 through one end thereof and is electrically connected to the input terminal of the fourth inverter IV4 through the other end thereof.

In the second output circuit 123 configured as described above, when the first control signal CTRL_A is enabled to a high level, an output signal of the fourth inverter IV4 may be inputted as an input signal of the fourth inverter IV4 after a delay time due to a resistance value of the second resistor R2. The resistive feedback inverting operation of the second output circuit 123 may include an operation in which the output signal of the fourth inverter IV4 is inputted again as the input signal of the fourth inverter IV4 via the second resistor R2.

Figure 4:
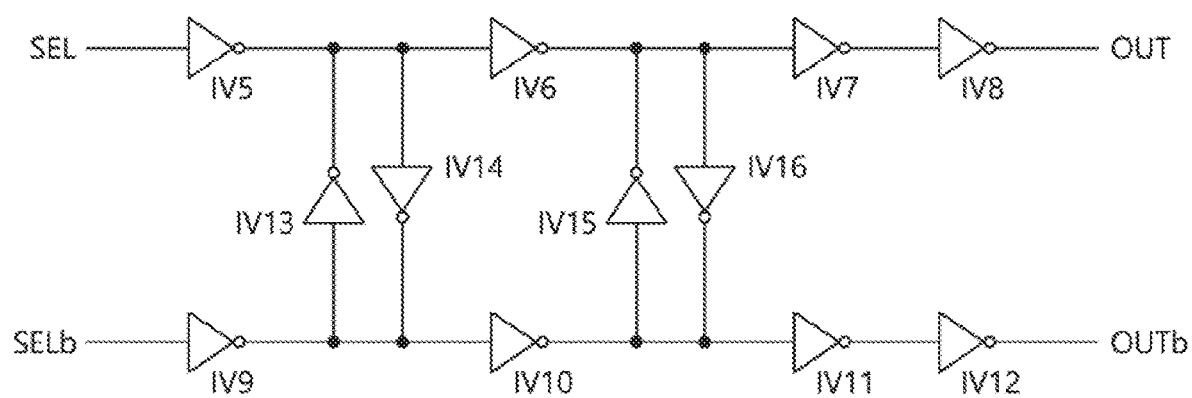
FIG. 4 shows a configuration diagram of a conversion circuit of FIG. 2, in accordance with an embodiment.

As illustrated in FIG. 4, the conversion circuit 200 illustrated in FIG. 2 may include fifth to sixteenth inverters IV5, IV6, IV7, IV8, IV9, IV10, IV11, IV12, IV13, IV14, IV15, and IV16. In such a case, each of the fifth to sixteenth inverters IV5 to IV16 may receive the first and second power supply voltages VDD and VSS, similarly to the logical elements illustrated in FIG. 3.

The fifth inverter IV5 receives the selection signal SEL. The sixth inverter IV6 receives an output signal of the fifth inverter IV5. The seventh inverter IV7 receives an output signal of the sixth inverter IV6. The eighth inverter IV8 receives an output signal of the seventh inverter IV7 and outputs the output signal OUT. The ninth inverter IV9 receives the selection bar signal SELb. The tenth inverter IV10 receives an output signal of the ninth inverter IV9. The eleventh inverter IV11 receives an output signal of the tenth inverter IV10. The twelfth inverter IV12 receives an output signal of the eleventh inverter IV11 and outputs the output bar signal OUTb. The thirteenth inverter IV13 has an input terminal to which a node, at which the ninth and tenth inverters IV9 and IV10 are electrically connected to each other, is electrically connected, and an output terminal to which a node, at which the fifth and sixth inverters IV5 and IV6 are electrically connected to each other, is electrically connected. The fourteenth inverter IV14 has an output terminal to which the node, at which the ninth and tenth inverters IV9 and IV10 are electrically connected to each other, is electrically connected, and an input terminal to which the node, at which the fifth and sixth inverters IV5 and IV6 are electrically connected to each other, is electrically connected. The fifteenth inverter IV15 has an input terminal to which a node, at which the tenth and eleventh inverters IV10 and IV11 are electrically connected to each other, is electrically connected, and an output terminal to which a node, at which the sixth and seventh inverters IV6 and IV7 are electrically connected to each other, is electrically connected. The sixteenth inverter IV16 has an output terminal to which the node, at which the tenth and eleventh inverter IV10 and IV11 are electrically connected to each other, is electrically connected, and an input terminal to which the node, at which the sixth and seventh inverters IV6 and IV7 are electrically connected to each other, is electrically connected. In such a case, the second and fourth inverters IV2 and IV4 respectively included in the first and second output circuits 113 and 123 of FIG. 3 may have driving ability smaller than that of the fifth to sixteenth inverters IV5 to IV16 illustrated in FIG. 4.

The operation of the swing level conversion circuit 3 configured as described above, in accordance with an embodiment, is described below with reference to FIGS. 2, 3 and 4.

As illustrated in FIG. 2, the swing level conversion circuit 3 may include the input selection circuit 100 and the conversion circuit 200.

The operation of the input selection circuit 100 is described below with reference to FIG. 3.

The first input circuit 111 may transfer the inputted first input signal IN_A to the first output circuit 113.

The second input circuit 112 transfers the second input bar signal IN_Bb to the first output circuit 113 or substantially prevents the transfer of the second input bar signal IN_Bb to the first output circuit 113 based on the first and second control signals CTRL_A and CTRL_B.

The third input circuit 121 may transfer the inputted first input bar signal IN_Ab to the second output circuit 123.

The fourth input circuit 122 transfers the second input signal IN_B to the second output circuit 123 or substantially prevents the transfer of the second input signal IN_B to the second output circuit 123 based on the first and second control signals CTRL_A and CTRL_B.

In accordance with an embodiment, when the first control signal CTRL_A of the first and second control signals CTRL_A and CTRL_B is enabled and the second control signal CTRL_B is disabled, transfer of the second input signal pair IN_B and IN_Bb to the first and second output circuits 113 and 123 is substantially prevented by the second and fourth input circuits 112 and 122. Meanwhile, the first and third input circuits 111 and 121 transfer the first input signal pair IN_A and IN_Ab to the first and second output circuits 113 and 123.

When the first control signal CTRL_A of the first and second control signals CTRL_A and CTRL_B is disabled and the second control signal CTRL_B is enabled, the second and fourth input circuits 112 and 122 transfer the second input signal pair IN_B and IN_Bb to the first and second output circuits 113 and 123.

As a consequence, the input selection circuit 100 transfers one of the first input signal pair IN_A and IN_Ab and the second input signal pair IN_B and IN_Bb to the first and second output circuits 113 and 123 based on the first and second control signals CTRL_A and CTRL_B.

Furthermore, when the first control signal CTRL_A is enabled, the first and second output circuits 113 and 123 invert inputted signals and output the inverted signals as the selection signal pair SEL and SELb, or perform the resistive feedback inverting operation on inputted signals and output the operation result as the selection signal pair SEL and SELb.

In brief, when the first control signal CTRL_A is enabled and the control signal CTRL_B is disabled, the input selection circuit 100, in accordance with an embodiment, performs the resistive feedback inverting operation on the first input signal pair IN_A and IN_Ab at the CML level and outputs the operation result as the selection signal pair SEL and SELb. Furthermore, when the first control signal CTRL_A is disabled and the second control signal CTRL_B is enabled, the input selection circuit 100, in accordance with an embodiment, performs the inverting operation on the second input signal pair IN_B and IN_Bb at the CMOS level and outputs the operation result as the selection signal pair SEL and SELb.

As illustrated in FIG. 4, and as indicated above, the conversion circuit 200 includes the fifth to sixteenth inverters IV5 to IV16, which operate by receiving the first and second power supply voltages VDD and VSS.

The fifth to eighth inverters IV5 to IV8 are serially connected to one another, receive the selection signal SEL, and generate the output signal OUT.

The ninth to twelfth inverters IV9 to IV12 are serially connected to one another, receive the selection bar signal SELb, and generate the output bar signal OUTb. The output signal OUT and the output bar signal OUTb are signals at the CMOS level, which swing to the levels of the first and second power supply voltages VDD and VSS.

The thirteenth and fourteenth inverters IV13 and IV14 and the fifteenth and sixteenth inverters IV15 and IV16 each have a latch-type connection structure, and may be electrically connected to nodes between the fifth to eighth inverters IV5 to IV8, which are serially connected to one another, and nodes between the ninth to twelfth inverters IV9 to IV12, which are serially connected to one another, respectively.

As a consequence, the conversion circuit 200 may receive the selection signal SEL and the selection bar signal SELb, and generate the output signal OUT and the output bar signal OUTb that swing to the levels of the first and second power supply voltages VDD and VSS.

The swing level conversion circuit 3 illustrated in FIGS. 2, 3, and FIG. 4 may select one of the first input signals IN_A and IN_Ab at the CML level and the second input signals IN_B and IN_Bb at the CMOS level based on the plurality of control signals CTRL_A and CTRL_B, and may output the selected signals as the output signals OUT and OUTb at the CMOS level. In such a case, the second input circuit 112 transfers the second input bar signal IN_Bb at the CMOS level to the conversion circuit 200 through the inverter IV2 of the first output circuit 113. The fourth input circuits 122 transfers the second input signal IN_B at the CMOS level to the conversion circuit 200 through the inverter IV4 of the second output circuit 123. The inverters IV2 and IV4 have driving ability smaller than that of the inverters IV5 and IV6 included in the conversion circuit 200 illustrated in FIG. 4, therefore it is possible to reduce power consumption when a CMOS to CMOS operation is performed.

The semiconductor apparatus 2 of FIG. 1 including the aforementioned swing level conversion circuit 3, in accordance with an embodiment, can receive a signal at the CMOS level inputted from another semiconductor apparatus 1 and output a signal at the CMOS level in a low speed operation mode. The semiconductor apparatus 2 can also receive a signal at the CML level inputted from the other semiconductor apparatus 1 and output a signal at the CMOS level in a high speed operation mode. That is, the semiconductor apparatus 2, in accordance with an embodiment, can normally operate even though the swing levels of the signals inputted in the low speed mode or the high speed mode are different from each other.

While various embodiments have been described above, it will be understood to those skilled in the art that the embodiments described above serve as examples only. Accordingly, the semiconductor apparatus described herein should not be limited based on the described embodiments.

What is claimed is:

1. A semiconductor apparatus comprising:
   an input selection circuit configured to select one of a first input signal and a second input signal in response to a control signal and configured to output the selected input signal as a selection signal, wherein swing levels of the first input signal and the second input signal are different from one another; and
   a conversion circuit configured to generate an output signal, in response to the selection signal, wherein the output signal swings to a level substantially identical to a level of the second input signal,
   wherein the input selection circuit comprises:
   a first input circuit configured to transfer the first input signal to an output circuit;
   a second input circuit configured to transfer the second input signal to the output circuit based on the control signal; and
   the output circuit configured to perform at least one of an inverting operation and a resistive feedback inverting operation on the first and second input signals, received from the first and second input circuits, based on the control signal and output a result of the operation as the selection signal.

2. The semiconductor apparatus according to claim 1, wherein the first input signal swings to a current mode logic (CML) level and the second input signal swings to a complementary metal-oxide semiconductor (CMOS) level.

3. The semiconductor apparatus according to claim 1, wherein an output terminal of the first input circuits is commonly connected to an output terminal of the second input circuit, and
   wherein, based on the control signal, the second input circuit transfers the second input signal to the output circuit or substantially prevents the transfer of the second input signal to the output circuit.

4. The semiconductor apparatus according to claim 2, wherein the conversion circuit comprises:
   a plurality of serially connected inverters configured to receive the selection signal,
   wherein each of the plurality of serially connected inverters receives a power supply voltage at the CMOS level.

5. The semiconductor apparatus according to claim 4, wherein the conversion circuit additionally comprises additional inverters, in a latch-type configuration, connected to at least one node among the plurality of serially connected inverters.

6. The semiconductor apparatus according to claim 4, wherein the output circuit comprises:
an inverter having a driving ability smaller than a driving ability of the plurality of serially connected inverters and the additional inverters included in the conversion circuit.

7. A semiconductor apparatus comprising:
a first input circuit comprising a capacitor that receives a first input signal at a current mode logic (CML) level and transfers the first input signal to an output circuit;
a second input circuit configured to, based on a control signal, transfer a second input signal at a complementary metal-oxide semiconductor (CMOS) level to the output circuit or substantially prevent the transfer of the second input signal to the output circuit; and
the output circuit configured to perform at least one of an inverting operation and a resistive feedback inverting operation on output of the first and second input circuits based on the control signal,
wherein the output circuit performs the resistive feedback inverting operation on the output of the first input circuit based on the control signal when the output of the first input circuit is transferred to the output circuit, and
wherein the output circuit performs the inverting operation on the output of the second input circuit based on the control signal when the output of the second input circuit is transferred to the output circuit.

8. The semiconductor apparatus according to claim 7, further comprising:
a conversion circuit configured to receive output of the output circuit and generate an output signal at the CMOS level.

9. The semiconductor apparatus according to claim 7, wherein the output circuit comprises:
an inverter configured to commonly receive the output of the first and second input circuits; and
a transistor and a resistor configured to feedback output of the inverter as input of the inverter based on the control signal.

10. The semiconductor apparatus according to claim 9, wherein the output circuit is configured to feedback the output of the inverter as the input of the inverter through the transistor and the resistor when the output of the first input circuit is transferred to the output circuit.

11. The semiconductor apparatus according to claim 10, wherein, when the output of the second input circuit is transferred to the output circuit, the output of the second input circuit is inverted through the inverter and is outputted by the output circuit.

12. The semiconductor apparatus according to claim 8, wherein the conversion circuit comprises:
a plurality of serially connected inverters configured to receive the output of the output circuit,
wherein each of the plurality of serially connected inverters receives a power supply voltage at the CMOS level.

13. The semiconductor apparatus according to claim 12, wherein the conversion circuit additionally comprises additional inverters, in a latch-type configuration, connected to at least one node among the plurality of serially connected inverters.

14. The semiconductor apparatus according to claim 12, wherein the output circuit comprises:
an inverter having a driving ability smaller than a driving ability of the plurality of serially connected inverters and the additional inverters included in the conversion circuit.

* * * * *